United States Patent
Kim et al.

(10) Patent No.: US 10,690,709 B2
(45) Date of Patent: Jun. 23, 2020

(54) SYSTEM FOR MONITORING RESISTANCE AND CURRENT IN GROUND LINE

(71) Applicant: SUNKWANG LIGHTING PROTECTION TECHNICAL INSTITUTE INC., Seoul (KR)

(72) Inventors: Dong-Jin Kim, Seoul (KR); Jong-Yeon Kim, Gyeonggi-do (KR); Wan-Seong Kwon, Seoul (KR); Dong-Min Kim, Jeju-do (KR); Yong-Su Kim, Seoul (KR); Byeong-U Kim, Seoul (KR)

(73) Assignee: SUNKWANG LIGHTNING PROTECTION TECHNICAL INSTITUTE INC., Seoul (KR)

( * ) Notice: Subject to any disclaimer, the term of this patent is extended or adjusted under 35 U.S.C. 154(b) by 14 days.

(21) Appl. No.: 16/307,035

(22) PCT Filed: Jun. 7, 2017

(86) PCT No.: PCT/KR2017/005893
§ 371 (c)(1),
(2) Date: Dec. 4, 2018

(87) PCT Pub. No.: WO2018/012741
PCT Pub. Date: Jan. 18, 2018

(65) Prior Publication Data
US 2019/0219620 A1     Jul. 18, 2019

(30) Foreign Application Priority Data
Jul. 13, 2016   (KR) ................ 10-2016-0088553

(51) Int. Cl.
*G01R 27/08*  (2006.01)
*G01R 27/18*  (2006.01)
(Continued)

(52) U.S. Cl.
CPC ............. *G01R 27/18* (2013.01); *G01R 15/18* (2013.01); *G01R 19/165* (2013.01); *G01R 27/20* (2013.01);
(Continued)

(58) Field of Classification Search
CPC ........ G01R 27/18; G01R 27/20; G01R 15/18; G01R 19/165; G01R 19/16547;
(Continued)

(56) References Cited

U.S. PATENT DOCUMENTS 8,131,485 B2 *  3/2012  Balcerek ............. G01R 31/088
                                                                    702/59
8,797,042 B2 *  8/2014  Ike .......................... H02H 3/16
                                                                    324/509
(Continued)

FOREIGN PATENT DOCUMENTS

JP        2013079974      5/2013
KR     1020050063009     6/2005
(Continued)

*Primary Examiner* — Thang X Le
(74) *Attorney, Agent, or Firm* — IPLA P.A.; James E. Bame

(57) ABSTRACT

A ground electrode (100) positioned in the earth and a monitoring device (200) configured to measure a current and resistance of a ground line, where the monitoring device (200) includes a ground current sensing unit (210) configured to measure the current of the ground line, a resistance sensing unit (220) configured to measure ground resistance of the earth and an earth resistance rate, a voltage sensing unit (230) configured to check a voltage value of commercial power, a temperature and humidity sensing unit (240) configured to check a surrounding temperature and humidity of the monitoring device (200), and a monitoring unit (250) configured to confirm whether the ground current, ground resistance and earth resistance measured are abnormal val- (Continued)

ues by compared with reference values classified based on the temperature and humidity measured.

4 Claims, 3 Drawing Sheets

(51) Int. Cl.
| | |
|---|---|
| *G01R 27/20* | (2006.01) |
| *G01R 19/165* | (2006.01) |
| *G08C 19/02* | (2006.01) |
| *G08C 17/02* | (2006.01) |
| *H04Q 9/00* | (2006.01) |
| *G01R 15/18* | (2006.01) |
| *G01R 31/50* | (2020.01) |

(52) U.S. Cl.
CPC ............ *G01R 31/50* (2020.01); *G08C 17/02* (2013.01); *G08C 19/02* (2013.01); *H04Q 9/00* (2013.01); *H04Q 2209/30* (2013.01); *H04Q 2209/823* (2013.01)

(58) Field of Classification Search
CPC ...... G01R 31/025; G01R 31/50; G01R 31/52; G01R 31/086; G01R 31/088
See application file for complete search history.

(56) References Cited

U.S. PATENT DOCUMENTS

| | | | |
|---|---|---|---|
| 9,199,539 B2* | 12/2015 | Iwanabe | G01R 31/025 |
| 9,612,269 B2* | 4/2017 | Wei | H02H 3/16 |
| 2006/0119368 A1* | 6/2006 | Sela | H02H 7/263 |
| | | | 324/522 |
| 2015/0289322 A1* | 10/2015 | Bartkowiak | H05B 6/067 |
| | | | 373/145 |
| 2018/0299396 A1* | 10/2018 | Freer | G01N 27/20 |

FOREIGN PATENT DOCUMENTS

| | | |
|---|---|---|
| KR | 101153296 | 7/2012 |
| KR | 1020120133753 | 12/2012 |
| KR | 101516776 | 5/2015 |

\* cited by examiner

1

SYSTEM FOR MONITORING RESISTANCE AND CURRENT IN GROUND LINE

CROSS REFERENCE

The present application claims the benefit of Korean Patent Application No. 10-2016-0088553 filed in the Korean Intellectual Property Office on Jul. 13, 2016, the entire contents of which are incorporated herein by reference.

BACKGROUND

The present invention relates to a system for monitoring the resistance and current of a ground line, which is positioned closer to ground equipment, such as a ground terminal box into which surge is introduced, to take measures for protecting equipment based on a measured value of a ground line by monitoring resistance and a current in the ground line in real time.

In general, a ground terminal box is positioned to protect electric equipment, such as an electronic device, communication equipment or measuring equipment, from the falling of a thunderbolt or surge. The ground terminal box functions to prevent damage to electric equipment by suppressing external overvoltage to a withstanding voltage of a device or less when the external overvoltage occurs and to maintain a normal operation. The ground terminal box is equipped with a surge protection device.

The ground terminal box protects electric equipment, but whether the ground terminal box itself malfunctions cannot be checked, consuming a lot of time, costs, and manpower. Accordingly, there is a need for a system capable of determining and predicting whether the ground terminal box malfunctions.

SUMMARY OF THE INVENTION

An object of the present invention is to provide a system for monitoring the resistance and current of a ground line, which is positioned closer to ground equipment, such as a ground terminal box into which surge is introduced, to take measures for protecting equipment based on a measured value of a ground line by monitoring resistance and a current in the ground line in real time.

A system for monitoring the resistance and current of a ground line according to an embodiment of the present invention includes a ground electrode 100 positioned in the earth and a monitoring device 200 configured to measure a current and resistance of a ground line. The monitoring device 200 includes a ground current sensing unit 210 configured to measure the current of the ground line, a resistance sensing unit 220 configured to measure ground resistance of the earth and an earth resistance rate, a voltage sensing unit 230 configured to check a voltage value of commercial power, a temperature and humidity sensing unit 240 configured to check a surrounding temperature and humidity of the monitoring device 200, and a monitoring unit 250 configured to confirm whether the ground current, ground resistance and earth resistance measured by the ground current sensing unit 210 and the resistance sensing unit 220 are abnormal values by compared with reference values classified based on the temperature and humidity measured by the temperature and humidity sensing unit 240.

The resistance sensing unit 220 includes a ground resistance sensing unit 221 configured to measure ground resistance between the ground electrodes 100 positioned in the earth by flowing a current for measurement into the ground electrodes 100 and an earth resistance rate sensing unit 222 configured to measure the earth resistance rate of the earth.

The monitoring unit 250 further includes a measurement power application unit 251 configured to apply power for measurement to the ground electrode 100 so that the ground resistance and the earth resistance rate are measured, a sensing value management unit 252 configured to receive information about the ground current, ground resistance and earth resistance rate measured by the ground current sensing unit 210, the voltage sensing unit 230 and the temperature and humidity sensing unit 240, a sensing value comparator 253 configured to check whether the sensing values received from the sensing value management unit 252 are abnormal values of references or higher by comparing the sensing values with reference values of a previously registered ground current, ground resistance and earth resistance rate so that the sensing values are distinguished based on temperature and humidity, an abnormal notification unit 254 configured to provide the external management center 300 with information about an abnormal item and an abnormal value if, as a result of the comparison of the sensing value comparator 253, the measured values of the current, ground resistance and earth resistance rate are found to be abnormal values, a sensing value display unit 255 positioned in an outside of the monitoring device 200 to display the sensing values received from the sensing value management unit 252 and an abnormal item and abnormal value checked by the sensing value comparator 253 so that the sensing values and the abnormal item and abnormal value are able to be viewed externally, and a sensing value notification unit 256 configured to provide the external management center 300 with information received by the sensing value management unit 252.

The ground current sensing unit 210 selectively measures a leakage current which is a fine current of a mA and a surge current which is a high current of a kA through a CT(Current Transducer) formed to surround a connection terminal connected to the ground line.

The measurement power application unit 251 is controlled by the external management center 300.

The sensing value management unit 252 provides the received sensing values to an external management server.

DETAILED DESCRIPTION OF THE INVENTION

Hereinafter, a system for monitoring the resistance and current of a ground line is described in detail with reference to the accompanying drawings.

Figure 1:
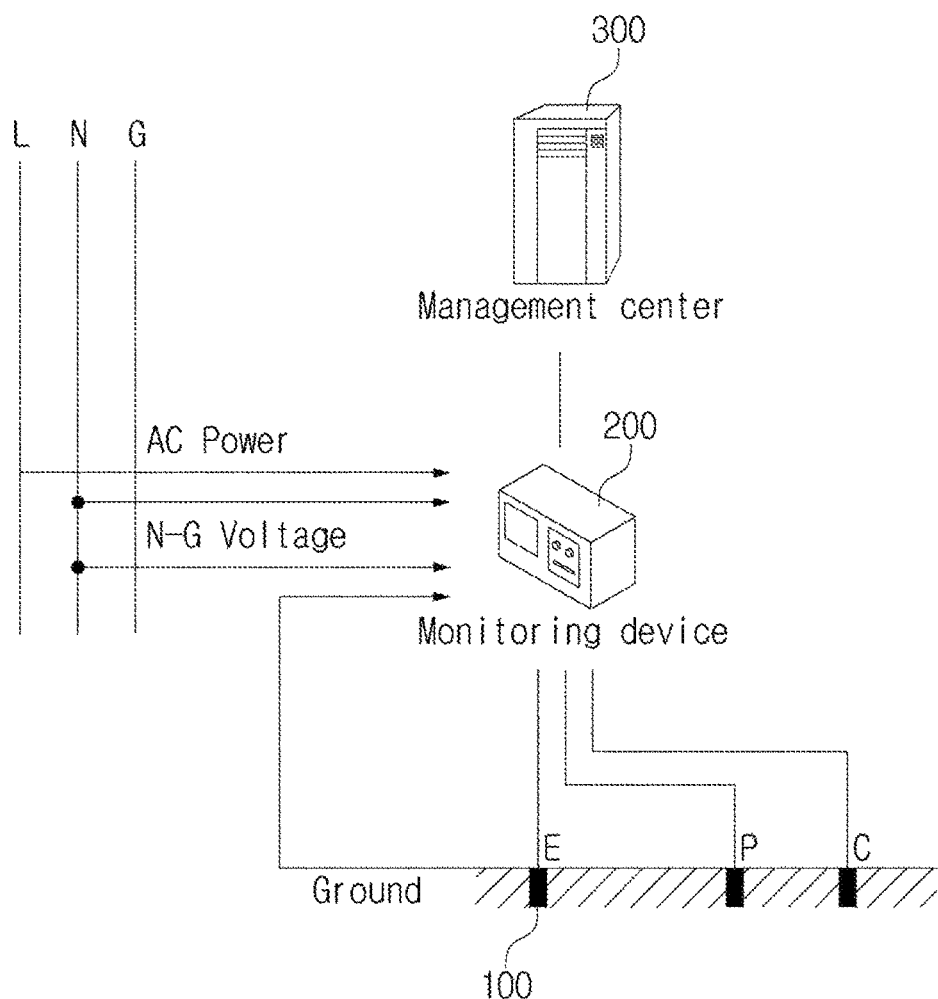
FIG. 1 is a schematic diagram of a system for monitoring the resistance and current of a ground line according to an embodiment of the present invention.

As shown in FIG. 1, the system for monitoring the resistance and current of a ground line according to an embodiment of the present invention includes a ground electrode 100 positioned in the earth and a monitoring device 200 configured to measure the current and resistance of a ground line G. The monitoring device 200 may be positioned closer to a ground terminal box.

Figure 2:
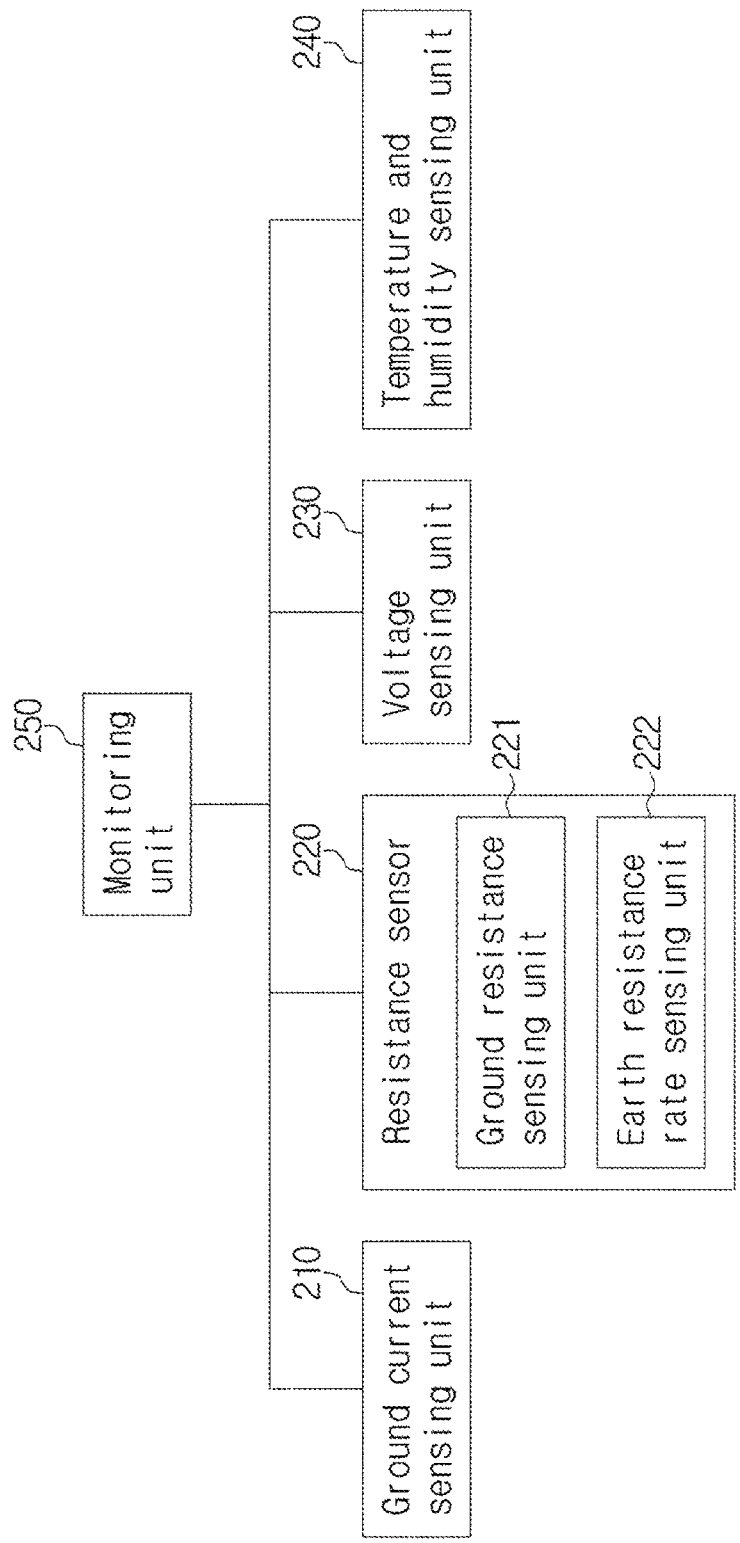
FIG. 2 is a block diagram of a monitoring device according to an embodiment of the present invention.

As shown in FIG. 2, the monitoring device 200 includes a ground current sensing unit 210 configured to measure the current of the ground line G, a resistance sensing unit 220 configured to measure ground resistance of the earth and an earth resistance rate, a voltage sensing unit 230 configured to check a voltage value of commercial power, and a temperature and humidity sensing unit 240 configured to check a surrounding temperature and humidity of the monitoring device 200, and a monitoring unit 250 configured to confirm whether the measured ground current, ground resistance and earth resistance are abnormal values by comparing the measured ground current, ground resistance and earth resistance with reference values.

The ground current sensing unit 210 is connected to the ground line G to measure a current flowing into the ground line. The ground current sensing unit 210 selectively measures a leakage current, that is, a fine current of a mA, and a surge current, that is, a high current of a kA through a CT formed to surround a connection terminal connected to the ground line G. Whether a short circuit has occurred in a ground terminal box connected to the system can be checked by measuring a current flowing into the ground line using the ground current sensing unit 210. Furthermore, whether a surge protector has been checked can be checked by confirming a surge current higher than that of a surge protector positioned to protect equipment by measuring the surge current of the ground line.

The resistance sensing unit 220 checks ground resistance of the earth. The resistance sensing unit 220 includes a ground resistance sensing unit 221 configured to measure ground resistance between the ground electrodes 100 by flowing a current for measurement into the ground electrodes 100 positioned in the earth and an earth resistance rate sensing unit 222 configured to measure the earth resistance rate of the earth. For example, the resistance sensing unit 220 may measure the ground resistance by checking a voltage between ground electrodes E-P and a voltage between ground electrodes P-C in such a way as to regularly flow a current for measurement into the ground electrodes E, P and C 100 positioned in the earth. The resistance sensing unit 220 may measure the earth resistance rate based on an electrode interval and a measured ground resistance value.

Qualitative values of the earth characteristics can be checked by checking a change in the ground resistance and earth resistance rate measured by the resistance sensing unit 220. Accordingly, an electric shock or a fire caused by a short circuit attributable to a phenomenon in which an earth voltage or higher occurs can be prevented.

The voltage sensing unit 230 measures a voltage of commercial power used as power for the monitoring device, and measures a potential difference between the ground line G and the neutral line N of power. The voltage sensing unit 230 can prevent a malfunction of equipment connected to the system or an operational suspension phenomenon which may occur when a change in the voltage occurs or a potential difference of ground equipment rises.

The temperature and humidity sensing unit 240 measures information about a surrounding temperature and humidity of the monitoring device 200. Temperature is measured by a temperature sensing unit, and humidity is measured by a humidity sensing unit.

Figure 3:
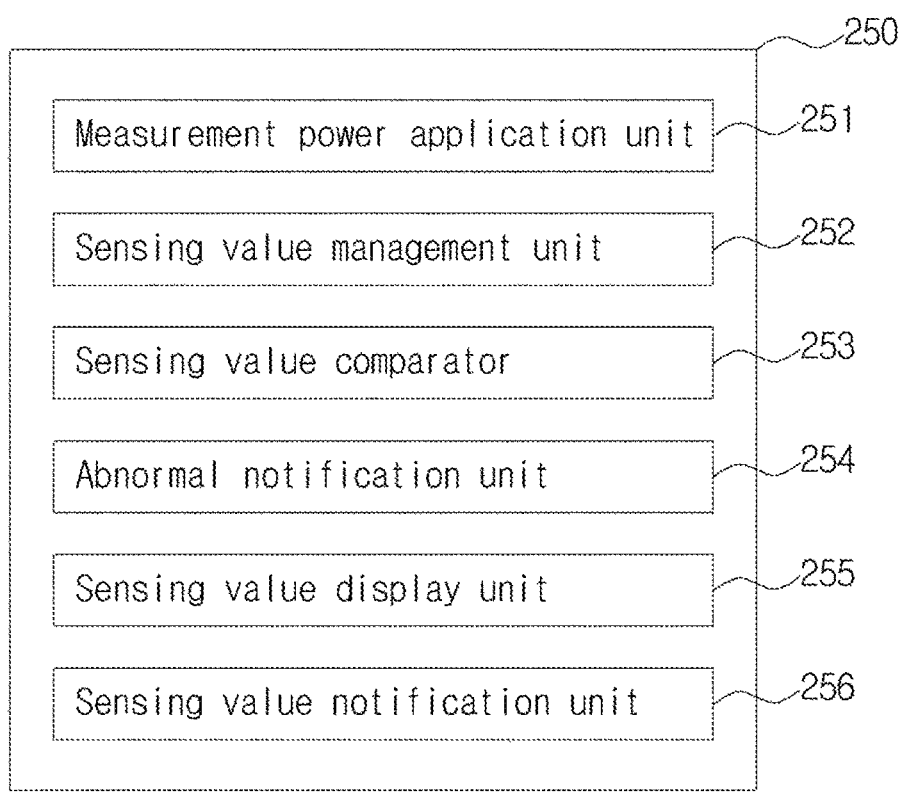
FIG. 3 is a block diagram of a monitoring unit according to an embodiment of the present invention.

As shown in FIG. 3, the monitoring unit 250 includes a measurement power application unit 251, a sensing value management unit 252, a sensing value comparator 253, an abnormal notification unit 254, a sensing value display unit 255 and a sensing value notification unit 256.

The measurement power application unit 251 applies power for measurement to the ground electrode 100 so that ground resistance and an earth resistance rate are measured. In this case, the measurement power application unit 251 may be controlled by an external management center 300.

The sensing value management unit 252 receives information about a ground current, ground resistance and an earth resistance rate measured by the ground current sensing unit 210, the voltage sensing unit 230 and the temperature and humidity sensing unit 240. In this case, the sensing value management unit 252 may provide the received sensing values to an external management server.

The sensing value comparator 253 confirms whether the sensing values received from the sensing value management unit 252 are abnormal values of a reference or more by comparing the sensing values with the reference values of a previously registered ground current, ground resistance and earth resistance rate. In this case, the reference values of the ground resistance and earth resistance rate are set to be distinguished based on temperature and humidity. A fine current and high current of the ground current have respective reference values.

If, as a result of the comparison of the sensing value comparator 253, it is found that the values of the current, ground resistance and earth resistance rate are abnormal values, the abnormal notification unit 254 provides the external management center 300 with an abnormal item and information about the abnormal value.

The sensing value display unit 255 is positioned in the outside of the monitoring device 200, and displays the sensing values received from the sensing value management unit 252 and an abnormal item and an abnormal value checked by the sensing value comparator 253 so that they can be viewed externally.

The sensing value notification unit 256 provides the external management center 300 with information received from the sensing value management unit 252.

The external management center 300 may recognize that a short circuit occurs in connected equipment when a measured current is a fine current of a reference or higher through the monitoring unit 250. A surge protector may be checked when the measured current is a high current higher than the capacity of the surge protector.

Hereinafter, an operating process of the system for monitoring the resistance and current of a ground line according to an embodiment of the present invention is described.

First, multiple ground electrodes 100 are positioned in the earth in which a ground rod is positioned. The ground electrodes 100 are connected to be supplied with power from the monitoring device 200.

The monitoring device 200 selectively measures a leakage current, that is, a fine current of an mA, and a surge current, that is, a high current of a kA, through a CT formed to surround a connection terminal connected to the ground line through the ground current sensing unit 210. Furthermore, the resistance sensing unit 220 measures ground resistance and an earth resistance rate while it flows a current for measurement into the ground electrode 100 positioned in the earth. In this case, the temperature and humidity sensing unit 240 measures a surrounding temperature and humidity of the monitoring device 200.

The current measured by the ground current sensing unit 210 and the ground resistance and earth resistance rate measured by the resistance sensing unit 220 are provided to the monitoring unit 250. The monitoring unit 250 confirms whether the current, ground resistance and earth resistance rate correspond to abnormal values by comparing them with registered reference values, respectively. In this case, the reference values may be differently set depending on temperature and humidity.

Furthermore, if a measured value corresponds to an abnormal value, the monitoring unit 250 provides external management center 300 with an item corresponding to the abnormal value.

Accordingly, the external management center 300 can take suitable measures according to a change in the atmospheric environment because it can check a change in the ground resistance according to temperature and humidity and a change in the earth resistance rate through the monitoring device 200 positioned closer to equipment, such as a ground terminal box. That is, when ground resistance and an earth resistance rate rise, performance of a ground rod that transmits a thunder and lightning to the earth is low when the falling of a thunderbolt occurs. Accordingly, an electric shock or a fire caused by a short circuit attributable to a phenomenon in which an earth voltage or higher occurs.

Furthermore, when a fine current measured by the ground current sensing unit 210 is a reference or higher, it may recognize that a short circuit occurs in connected equipment. When a high current is a reference or higher, that is, the capacity of a surge protector, whether the surge protector has been checked can be checked.

When a voltage of commercial power used as power in the voltage sensing unit 230 and a potential difference between the earth G and the neutral line N are measured and provided to the monitoring unit 250, the monitoring unit 250 compares them with a reference commercial voltage. If, as a result of the comparison, the voltage and potential difference are found to be references or higher, a malfunction or operation suspension phenomenon of connected equipment which may occur when a change or a potential difference of ground equipment occurs can be prevented.

The system for monitoring the resistance and current of a ground line according to the embodiment of the present invention has advantages in that it can measure the leakage current of equipment by checking a fine current based on a change in the ground current and check whether the surge protector of a ground terminal box has been checked by checking a high current.

Furthermore, the system has an advantage in that it can prevent an electric shock or a fire caused by a short circuit attributable to a phenomenon in which an earth voltage or higher occurs because it can check a change characteristic of ground resistance.

Furthermore, the system has an advantage in that it can prevent a malfunction or operation suspension of equipment which may occur when a potential difference of ground equipment rises because it can check a voltage change in power.

As described above, although the present invention has been described in connection with the limited embodiments and drawings, the present invention is not limited to the embodiments and drawings. A person having ordinary skill in the art to which the present invention pertains may modify and change the present invention within the technical spirit of the present invention and the equivalent range of the following claims.

What is claimed is:

1. A system for monitoring resistance and current of a ground line, the system comprising:
    a ground electrode (100) positioned in an earth; and
    a monitoring device (200) configured to measure a current and resistance of a ground line,
    wherein the monitoring device (200) comprises:
    a ground current sensing unit (210) configured to measure the current of the ground line;
    a resistance sensing unit (220) configured to measure ground resistance of the earth and an earth resistance rate;
    a voltage sensing unit (230) configured to check a voltage value of commercial power;
    a temperature and humidity sensing unit (240) configured to check a surrounding temperature and humidity of the monitoring device (200); and
    a monitoring unit (250) configured to confirm whether the ground current, ground resistance and earth resistance measured by the ground current sensing unit (210) and the resistance sensing unit (220) are abnormal values by compared with reference values classified based on the temperature and humidity measured by the temperature and humidity sensing unit (240),
    wherein the resistance sensing unit (220) comprises:
    a ground resistance sensing unit (221) configured to measure ground resistance between the ground electrodes (100) positioned in the earth by flowing a current for measurement into the ground electrodes (100) and an earth resistance rate sensing unit (222) configured to measure the earth resistance rate of the earth, and
    wherein the monitoring unit (250) further comprises:
    a measurement power application unit (251) configured to apply power for measurement to the ground electrode (100) so that the ground resistance and the earth resistance rate are measured;
    a sensing value management unit (252) configured to receive information about the ground current, ground resistance and earth resistance rate measured by the ground current sensing unit (210), the voltage sensing unit (230) and the temperature and humidity sensing unit (240);
    a sensing value comparator (253) configured to check whether the sensing values received from the sensing value management unit (252) are abnormal values of references or higher by comparing the sensing values with reference values of a previously registered ground current, ground resistance and earth resistance rate so that the sensing values are distinguished based on temperature and humidity;
    an abnormal notification unit (254) configured to provide the external management center (300) with information about an abnormal item and an abnormal value if, as a result of the comparison of the sensing value comparator (253), the measured values of the current, ground resistance and earth resistance rate are found to be abnormal values;
    a sensing value display unit (255) positioned in an outside of the monitoring device (200) to display the sensing values received from the sensing value management unit (252) and an abnormal item and abnormal value checked by the sensing value comparator (253) so that the sensing values and the abnormal item and abnormal value are able to be viewed externally; and
    a sensing value notification unit (256) configured to provide the external management center (300) with information received by the sensing value management unit (252).

2. The system of claim 1, wherein the ground current sensing unit (210) selectively measures a leakage current which is a fine current of an mA and a surge current which is a high current of a kA through a CT (Current Transducer) formed to surround a connection terminal connected to the ground line.

3. The system of claim 1, wherein the measurement power application unit (251) is controlled by the external management center 300.

4. The system of claim 1, wherein the sensing value management unit (252) provides the received sensing values to an external management server.

\* \* \* \* \*